(12) United States Patent
Liaw

(10) Patent No.: US 9,590,104 B2
(45) Date of Patent: Mar. 7, 2017

(54) GATE DEVICE OVER STRAINED FIN STRUCTURE

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 14/062,993

(22) Filed: Oct. 25, 2013

(65) Prior Publication Data
US 2015/0115334 A1  Apr. 30, 2015

(51) Int. Cl.
| | | |
|---|---|---|
| *H01L 29/76* | (2006.01) | |
| *H01L 29/78* | (2006.01) | |
| *H01L 29/66* | (2006.01) | |
| *H01L 21/762* | (2006.01) | |
| *H01L 21/8234* | (2006.01) | |
| *H01L 21/8238* | (2006.01) | |
| *H01L 21/84* | (2006.01) | |
| *H01L 27/088* | (2006.01) | |
| *H01L 27/092* | (2006.01) | |
| *H01L 27/12* | (2006.01) | |
| *H01L 29/10* | (2006.01) | |

(52) U.S. Cl.
CPC .... *H01L 29/7849* (2013.01); *H01L 21/76224* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/1211* (2013.01); *H01L 29/1054* (2013.01); *H01L 29/66545* (2013.01); *H01L 29/66795* (2013.01)

(58) Field of Classification Search
CPC ........ H01L 29/1054; H01L 29/7842–29/7849; H01L 29/785–29/7856; H01L 29/41791; H01L 21/823431; H01L 21/823821; H01L 21/845; H01L 27/0886; H01L 27/0924; H01L 27/1211
See application file for complete search history.

(56) References Cited

U.S. PATENT DOCUMENTS

| | | |
|---|---|---|
| 6,855,990 B2 | 2/2005 | Yeo et al. |
| 7,074,623 B2 | 7/2006 | Langdo et al. |
| 7,224,033 B2 | 5/2007 | Zhu et al. |
| 7,915,112 B2 | 3/2011 | Xu et al. |
| 8,310,013 B2 | 11/2012 | Lin et al. |
| 8,415,216 B2 * | 4/2013 | Anderson ......... H01L 29/66795 257/270 |

(Continued)

*Primary Examiner* — Jesse Y Miyoshi
*Assistant Examiner* — Tuan A Hoang
(74) *Attorney, Agent, or Firm* — Haynes and Boone, LLP

(57) ABSTRACT

A method for forming a semiconductor device includes forming a fin structure on a substrate, forming a shallow trench isolation region adjacent the fin structure so that an upper portion of the fin structure is exposed, forming a dummy gate over the exposed fin structure, forming an interlayer dielectric layer around the dummy gate, removing the dummy gate to expose the fin structure, and after removing the dummy gate, introducing a strain into a crystalline structure of the exposed fin structure.

17 Claims, 9 Drawing Sheets

(56) References Cited

U.S. PATENT DOCUMENTS

| | | | |
|---|---|---|---|
| 8,518,781 B2* | 8/2013 | Fumitake | H01L 27/098 257/E21.444 |
| 8,723,236 B2 | 5/2014 | Liu et al. | |
| 2006/0292762 A1* | 12/2006 | Borland | H01J 37/3171 438/151 |
| 2013/0237026 A1* | 9/2013 | Lee et al. | 438/283 |

* cited by examiner

GATE DEVICE OVER STRAINED FIN STRUCTURE

BACKGROUND

Integrated circuits may be formed using various photolithographic techniques. Such techniques are used to form different types of components and devices including transistors. One type of transistor is a Metal Oxide Semiconductor Field Effect Transistor (MOSFET). MOSFET devices use a gate terminal, a source terminal, and a drain terminal. Among other functions, the MOSFET device may act as a switch. When acting as a switch, the signal applied to the gate terminal will either cause the MOSFET device to allow or prohibit current flow between the source and drain terminals.

The source and drain components of a MOSFET device typically include doped regions of a semiconductor substrate or material. The channel between the source and drain regions underneath a gate device may be shaped like a fin that passes through the bottom portion of the gate structure in a perpendicular manner. Transistors that use fin shaped channels are sometimes referred to as finFETs.

In some cases, it can be beneficial to introduce a strain into the fin structures. Straining may be done by injecting a type of semiconductor with a different lattice constant than the original semiconductor material. For example, a silicon fin may be doped with silicon-germanium. This will cause a strain in the crystalline structure of the fin. If done properly, this can increase carrier mobility and thus increase the efficiency of the fin. This straining process, however, can be harmed by various processes such as thermal annealing. Thermal annealing is part of forming source and drain regions. It is desirable form strained structures that will not be adversely affected by various processes such as thermal annealing.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
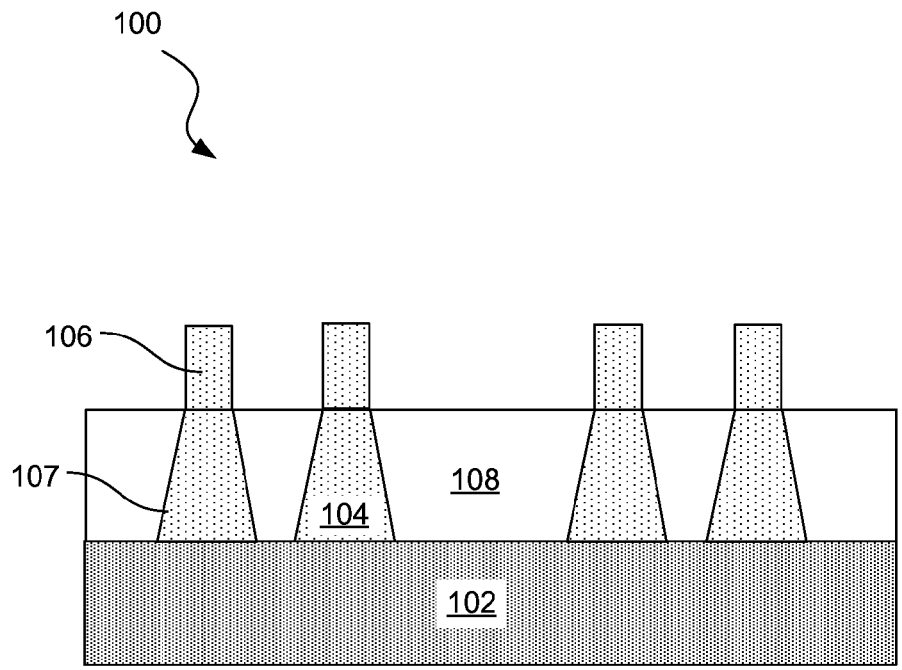
FIGS. 1A-1F are diagrams showing an illustrative method of forming a gate device with strained fin structures, according to one example of principles described herein.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A - 1F are diagrams showing an illustrative method of forming a gate device with strained fin structures. According to the present example, a number of fin structures 104 are formed onto a substrate 102. For purposes of discussion, the fin structures 104 include an upper portion 106 and a lower portion 107.

According to the present example, the fin structures 104 may be formed using standard semiconductor fabrication processes. Such processes may include deposition, etching, photolithography, etc. In this example, two fin structures 104 are associated with a single gate device. In some examples, however, there may be one fin structure 104 associated with a gate device. In a further example, there may be more than two fin structures 104 associated with a single gate device.

According to the present example, an isolation structure 108 is formed between the fin structures 104. The isolation structure 108 may be, for example, a Shallow Trench Isolation (STI) structure. The isolation structure 108 is a dielectric material designed to isolate various features from nearby features. For examples, the isolation structure 108 may prevent electric current flowing through one fin structure from flowing to another fin structure 104. The isolation structure 108 is formed around the lower portion 107 of the fin structures. The upper portion 106 of the fin structures 104 remains exposed.

Figure 1B:
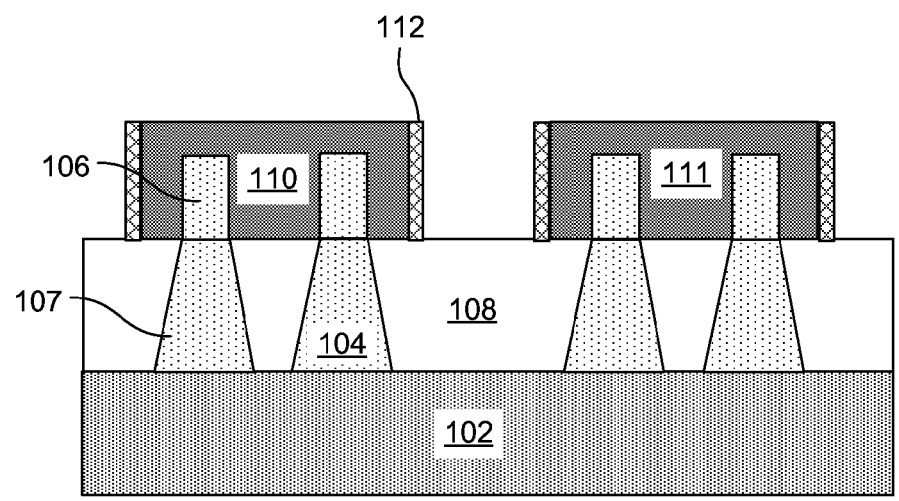

FIG. 1B is a diagram showing the formation of dummy gate devices 110, 111 over the fin structures. According to the present example, dummy gates 110, 111 are formed over the upper portion 106 of the fin structures 104. The two dummy gates 110, 111 each correspond to two different fin structures 104. In one example, the first dummy gate 110 may be associated with a PMOS (p-type Metal Oxide Semiconductor) transistor and the second dummy gate 111 may be associated with an NMOS (n-type Metal Oxide Semiconductor) transistor.

According to the present example, sidewall spacers 112 are formed on the edges of the dummy gates 110, 111. The sidewall spacers 112 may be formed using various deposition processes or epitaxial growth processes. The sidewall spacers 112 are designed to stay in place even after the dummy gates 110, 111 are removed, which will be discussed in more detail below.

Figure 1C:
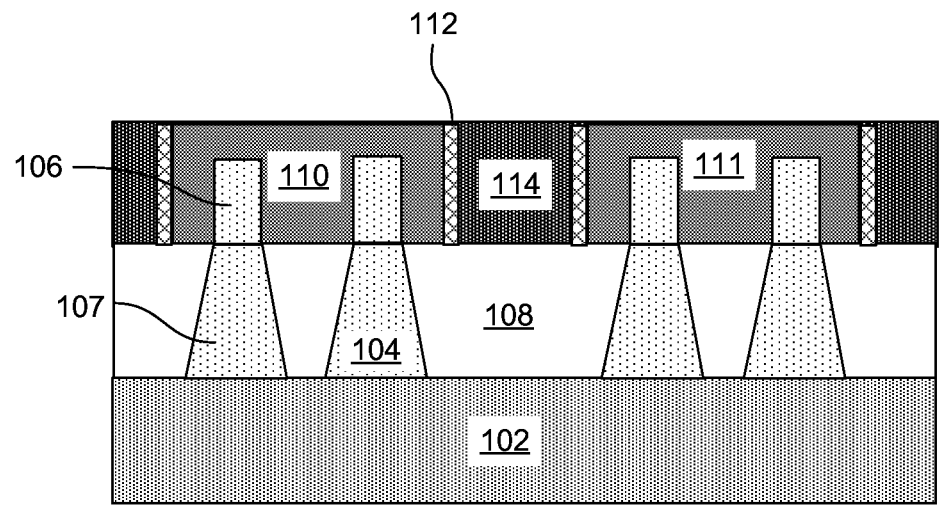

FIG. 1C illustrates the formation of an interlayer dielectric (ILD) layer 114. According to the present example, the ILD layer 114 is formed to surround the dummy gates 110, 111. In one example, the ILD layer 114 is formed partially over the dummy gate devices 110, 111. A Chemical Mechanical Polishing (CMP) process, however, can remove part of the ILD layer 114 to expose the top of the dummy gates 110, 111. The ILD layer 114 is used to isolate components of adjacent layer from each other.

Figure 1D:
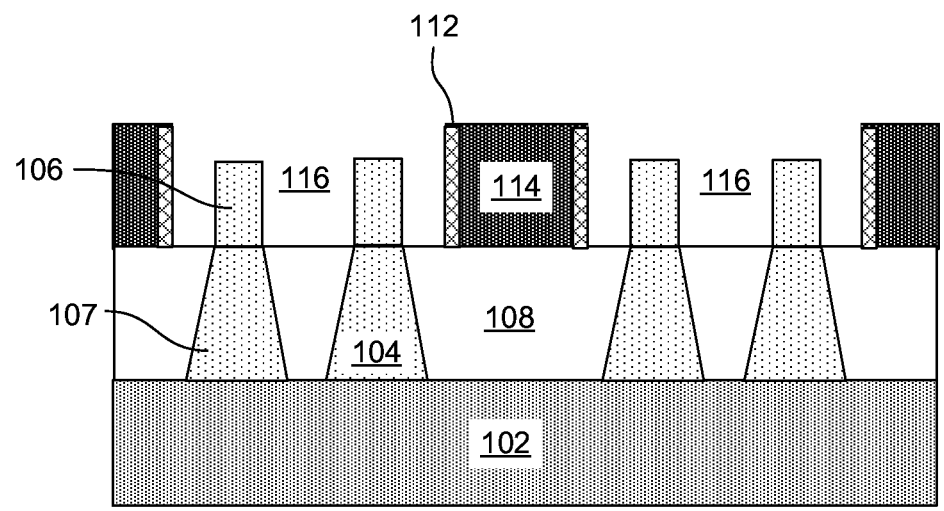

FIG. 1D illustrates the removal of the dummy gates 110, 111 to expose the upper portion 106 of the fin structures 104. Removal of the dummy gates 110, 111 may be done through a selective etching process. A selective etching process is designed to remove one type of material while leaving other types of material intact. For example, the etching process may be designed to remove the dummy gate material but leave the ILD layer 114 and the sidewall spacers 112 intact. Removal of the dummy gates 110, 111 leaves two openings 116 into which real gates may be subsequently placed.

Figure 1E:
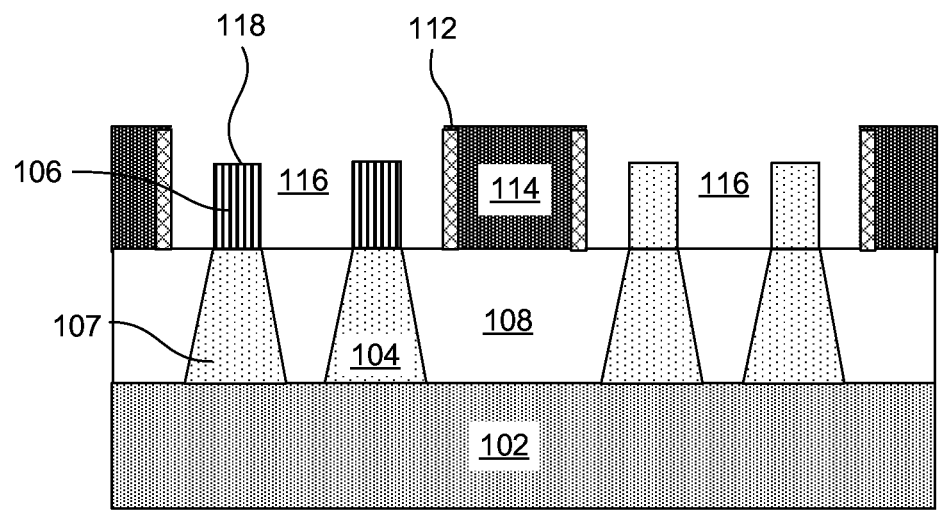

FIG. 1E is a diagram showing an illustrative straining process. According to the present example, the upper portions 106 of some of the fin structures 104 are strained. This may be done by a variety of methods. In one example, the upper portions 106 of the fin structures 104 are doped with a semiconductor material having a different lattice constant than the original semiconductor material. For example, if the fin structures 104 are made of silicon, then the fin structures 104 may be doped with germanium which has a different lattice constant. Alternatively, the fin structures 104 may be doped with a type III-V semiconductor material.

The straining material may be introduced by various doping processes. In one example, the straining material is introduced using ion implantation. In one example, the straining material is introduced using a diffusion process.

In some examples, the upper portion 106 of the fin structures 104 may be removed and then replaced with an epitaxial strained semiconductor. An epitaxial process may be used to selectively grow the upper portions 106 of the fin structures with the strained material on the top of the lower portions 107 of the fin structures 104. Other methods may be used to introduce the straining material are contemplated.

In this example, the fin structures 104 within the first opening 116 are strained but the fin structures 104 of the second opening 117 are not strained. In some cases, it may be desirable to introduce strain into one gate and not the other gate because the gates may have different design purposes. For example, one gate may be for an NMOS device while the other gate may be for a PMOS device. In some cases, the fin structures for multiple openings 116, 117 may be strained differently. The different straining processes may be based on the type of transistor for which the gate will be used.

As mentioned above, the processes that are used to strain the fin structures may be harmful to various metal structures including metal gates. Additionally, other doping processes are performed on the semiconductor substrate 102. For example, the source and drain regions are formed using various doping processes. A thermal annealing process is then performed on the source and drain regions. This process can be harmful to the strained material. Thus, the strained material is formed after this annealing process. The annealing process is also typically performed with the dummy gates in place. Thus, the straining process takes place after the dummy gates have been removed and before the metal replacement gates are formed.

Figure 1F:
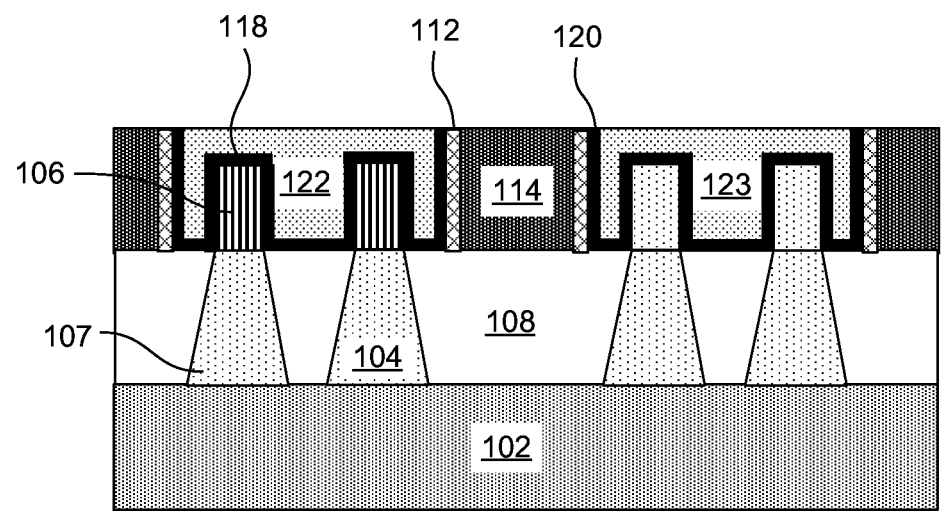

FIG. 1F illustrates formation of the replacement metal gates 122, 123. According to the present example, a high-k dielectric layer 118 is formed over the upper portions 106 of the fin structures 104 as well as the rest of the opening 116 left by removal of the dummy gates 110, 111. The high-k dielectric layer 118 is commonly used with metal gate structures as insulation between the metal material and the semiconductor material.

After the high-k material 118 is in place, the metal gates 122, 123 can then be formed. The metal gates 122, 123 may be formed by deposition of a metal material into the openings 116 left by removal of the dummy gates 110, 111. A CMP process may then be used to smooth the surface of the ILD layer 114.

Figure 2A:
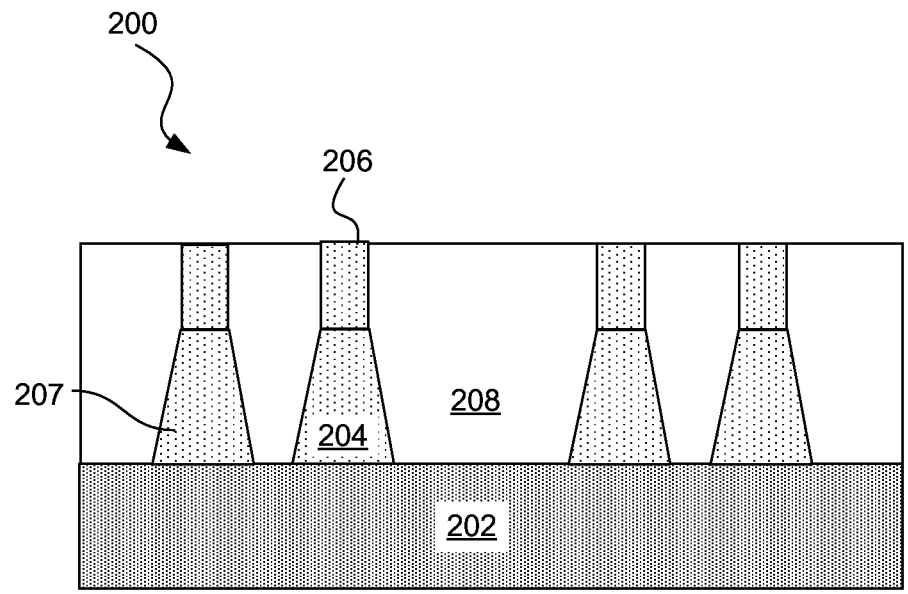
FIGS. 2A-2G are diagrams showing an illustrative method of forming a gate device with epitaxial grown strained fin structures, according to one example of principles described herein.

FIGS. 2A-2G are diagrams 200 showing an illustrative method of forming a gate device with strained fin structures 204. FIG. 2A is a diagram showing formation of an isolation structure 208 around fin structures 204. The fin structures 204 are formed onto a substrate 202. The fin structures 204 include an upper portion 206 and a lower portion 207.

In the present example, the isolation structure 208 is formed such that it covers both the upper portions 206 and the lower portions 207 of the fin structures 204. In some examples, a CMP process may be used to smooth the surface of the isolation structure 208. The isolation structure 208 may be an STI structure.

Figure 2B:
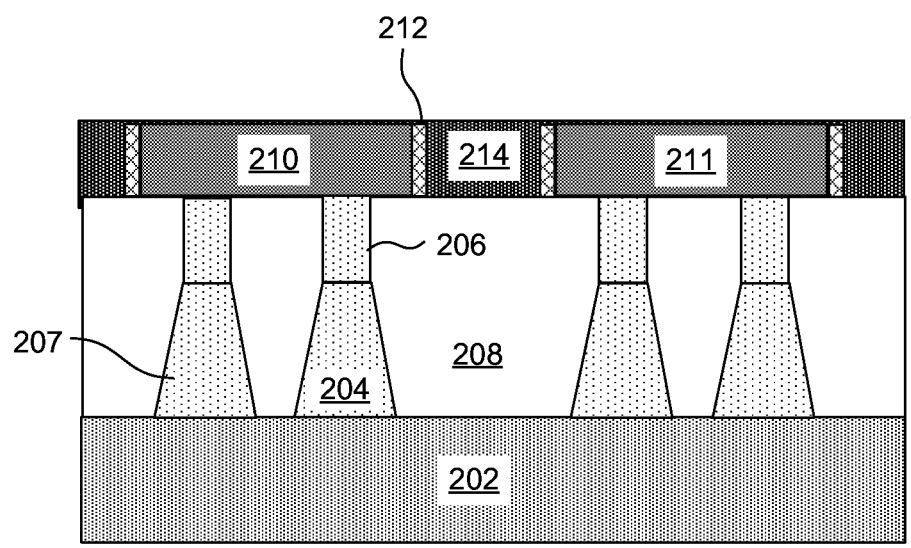

FIG. 2B is a diagram showing the formation of dummy gates 210, 211. According to the present example, the dummy gates 210, 211 shown are not as tall as the dummy gates 110, 111 shown in FIG. 1. This is because the isolation structure 208 is higher than the isolation structure 108 of FIG. 1.

After the dummy gates 210, 211 are formed, sidewall spacers 212 are formed on the sides of the dummy gates 210, 211. The height of these sidewall spacers 212 is also less than the height of the sidewall spacers 112 of FIG. 1. After the sidewall spacers 212 are formed on the dummy gates 210, 211, an ILD layer 214 is formed to surround the dummy gates 210, 211. Again, a CMP process may be used to smooth the surface of the ILD layer 214 and the dummy gates 210, 211.

Figure 2C:
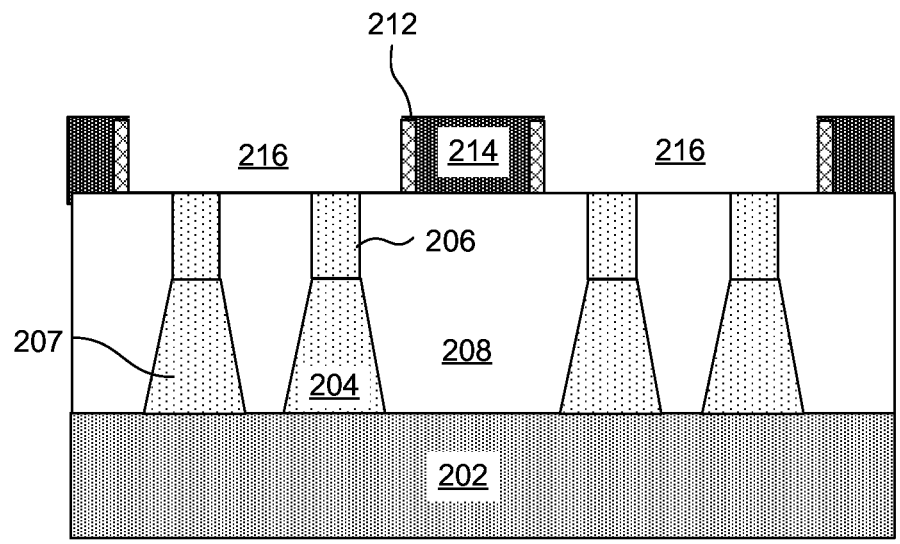

FIG. 2C illustrates the removal of the dummy gates 210, 211, to leave openings 216. The dummy gates 210, 211 may be removed through various processes such as selective etching. Specifically, a selective etching process that removes only the dummy gate material while leaving the ILD layer 214 and the sidewall spacers 212 intact may be used.

Figure 2D:
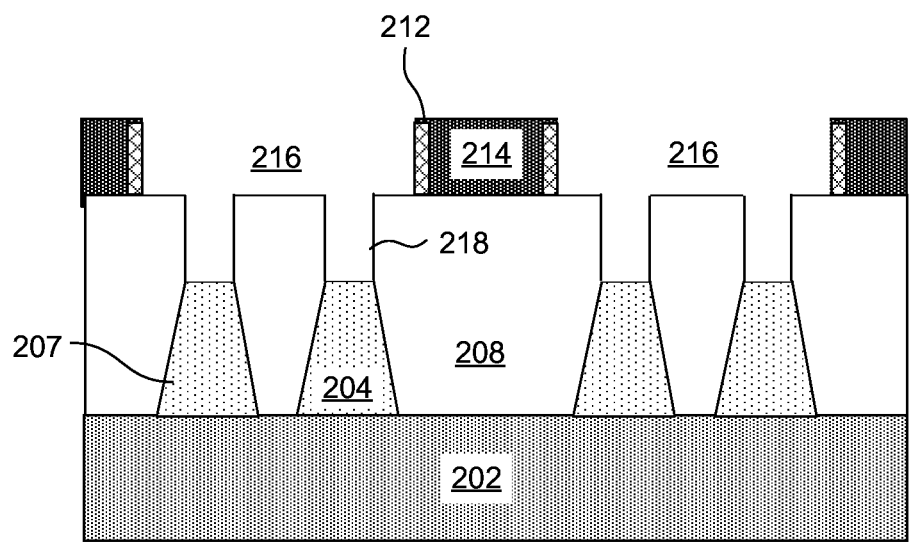

FIG. 2D illustrates the removal of the upper portions 206 of the fin structures 204. Again, this may be done through a selective etching process that removes only the fin structure material while leaving the ILD layer 214, the sidewall spacers 212, and the isolation structure 208 intact. Removal of the upper portions 206 of the fin structures leaves behind a set of trenches 218. These trenches 218 can then be used to form new upper portions of the fin structures 204.

Figure 2E:
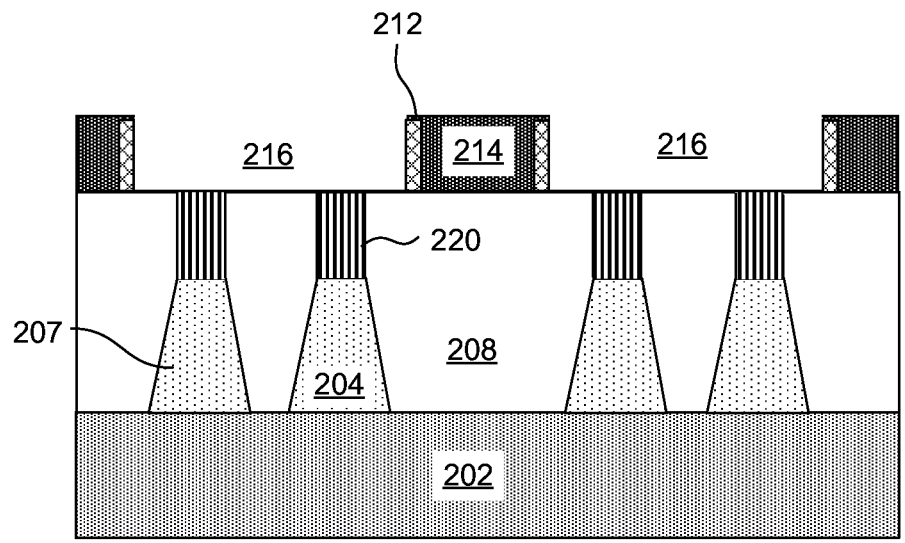

FIG. 2E illustrates the formation of strained upper portions 220 of the fin structures 204 in the trenches 218 left by removal of the original upper portions 206 of the fin structures 204. The strained upper portions 220 may be formed through an epitaxial growth process that is designed to grow a crystalline structure from the semiconductor material forming the lower portions 207 of the fin structures 204. Because the strained upper portions 220 are grown in the trenches 216, the epitaxial growth process is constrained to the desired dimensions. Thus, a better strained fin structure 204 is formed.

The strained nature of the strained upper portions 220 of the fin structures 204 results from growing a crystalline structure with different elements having different lattice constants. For example, the strained upper portions 220 of the fin structures 204 may be made of silicon and germanium. In some examples, other semiconductor materials such as type III-V semiconductor materials may be used.

Figure 2F:
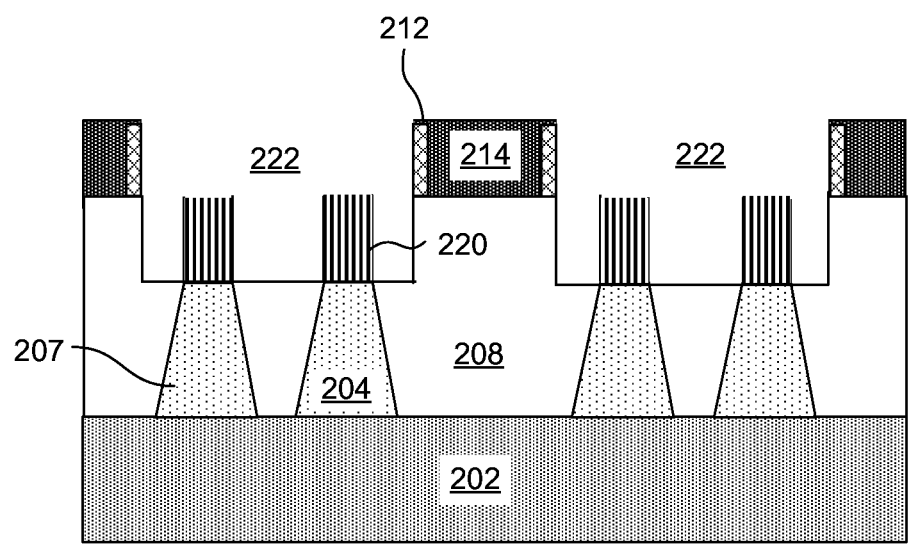

FIG. 2F is a diagram showing removal of a portion of the isolation structure 208 to expose the strained upper portions 220 of the fin structures 204. This forms a complete opening 222 for the replacement gates. The removal process may be done through a selective etching process that is designed to remove the isolation structure 208 while leaving the strained upper portions 220 of the fin structures 204, the ILD 214, and the sidewall spacers 212 intact.

Figure 2G:
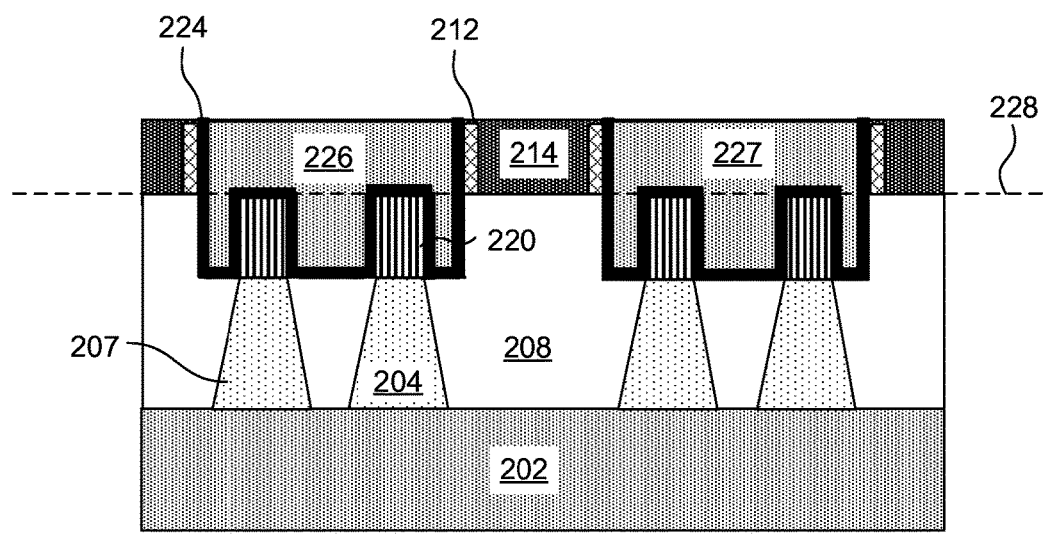

FIG. 2G is a diagram showing the final gate structures formed into the complete openings 222. According to the present example, a high-k dielectric layer 224 is formed over the upper portions 220 of the fin structures 204 as well as the rest of the complete opening 222 left by removal of the dummy gates 210, 211 and isolation material 208. The high-k dielectric layer is 224 commonly used with metal gate structures 226, 227 as insulation between the metal material and the semiconductor material.

After the high-k material is in place, the metal gates 226, 227 can then be formed. The metal gates 226, 227 may be formed by deposition of a metal material into the complete openings 222. A CMP process may then be used to smooth the surface of the metal gates and ILD layer 214.

In the present example, performance of the above described process results in a structure in which the border 228 between the ILD 214 and the isolation structure 208 is between the top and bottom of the metal gates 226, 227. Additionally, the sidewall spacers 212 adjacent the metal gates 226, 227 extend down to the border 228 instead of extending the entire height of the metal gates 226, 227. The border 228 also corresponds with the height of the strained upper portions 220 of the fin structures 204. While in this example, the border 228 is shown in the exact middle between the top and bottom of the metal gates 226, 227, other locations of the border between the top and bottom of the metal gates 226, 227 are contemplated. For example, the border 128 may be closer to the top or closer to the bottom of the metal gates 226, 227.

Figure 3:
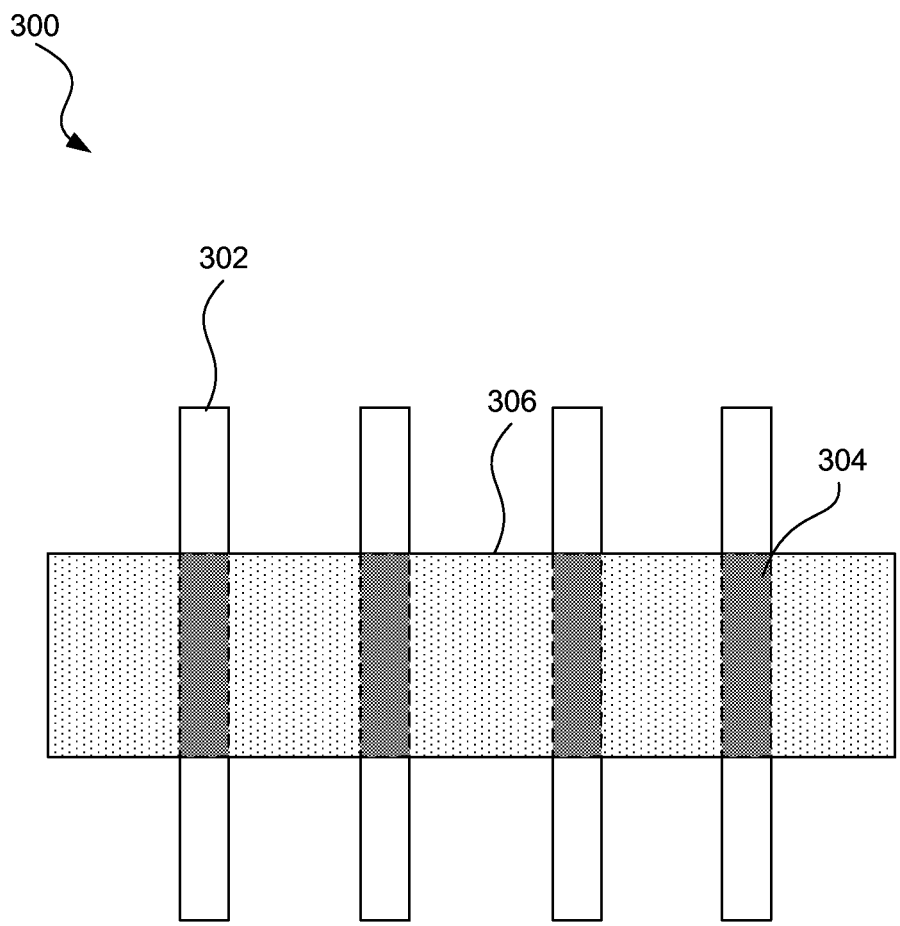
FIG. 3 is a diagram showing a top view of an illustrative gate device over strained fin structures, according to one example of principles described herein.

FIG. 3 is a diagram showing a top view of an illustrative gate device 300 over strained fin structures 302. According to the present example, the gate device 300 is formed over four separate fin structures 302. The fin structures 302 run perpendicular to the gate structure 306 and parallel to each other. The regions 304 of the fin structures 302 that are strained lay underneath the gate structure 306. The remaining portions of the fin structures 302 may remain unstrained. The strained regions 304 are shown with dashed lines because they are positioned underneath the gate structure 306.

Figure 4:
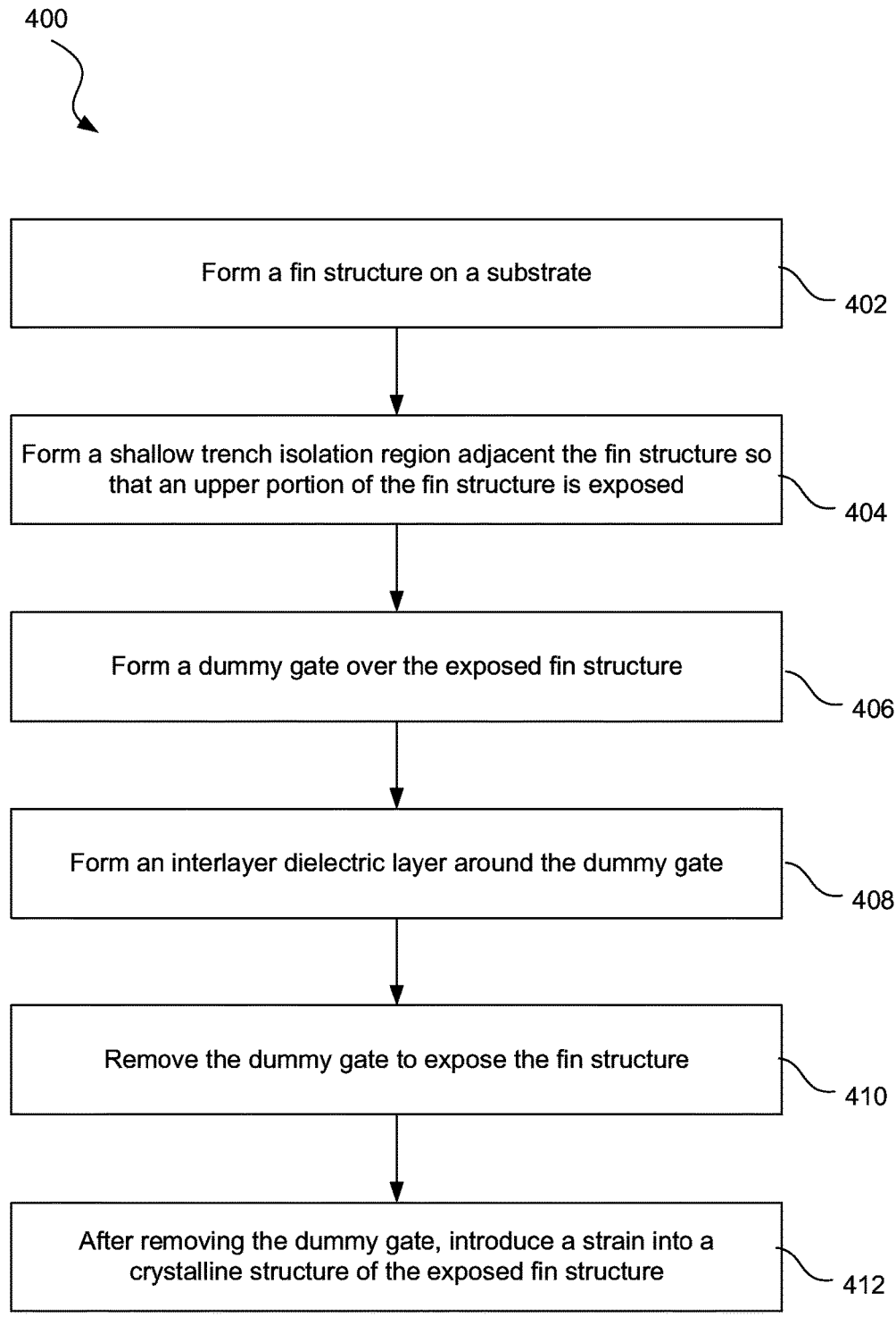
FIG. 4 is a flowchart showing an illustrative method for forming a gate device over strained fin structures, according to one example of principles described herein.

FIG. 4 is a flowchart showing an illustrative method for forming a gate device over strained fin structures. According to the present example, the method includes a step for forming 402 a fin structure on a substrate. The method further includes a step for forming 404 a shallow trench isolation region adjacent the fin structure so that an upper portion of the fin structure is exposed. The method further includes a step for forming 406 a dummy gate over the exposed fin structure. The method further includes a step for forming 408 an interlayer dielectric layer around the dummy gate. The method further includes a step for removing the dummy gate 410 to expose the fin structure. The method further includes a step for, after removing the dummy gate, introducing 412 a strain into a crystalline structure of the exposed fin structure.

According to certain illustrative examples, a method for forming a gate device over a strained fin structure includes forming a fin structure on a substrate, forming a shallow trench isolation region adjacent the fin structure so that an upper portion of the fin structure is exposed, forming a dummy gate over the exposed fin structure, forming an interlayer dielectric layer around the dummy gate, removing the dummy gate to expose the fin structure, and after removing the dummy gate, introducing a strain into a crystalline structure of the exposed fin structure.

According to certain illustrative examples, forming a first and second fin structure onto a substrate, forming an isolation structure between the fin structures, applying a Chemical Mechanical Polishing (CMP) process to the substrate, forming a first dummy gate over the first fin structure and a second dummy gate over the second fin structure, forming an interlayer dielectric layer around the first and second dummy gates, removing the first and second dummy gates, after removing the first and second dummy gates, selectively removing a top portion of the first and second fin structures, and in one of the openings left by removing the first and second fin structures, forming a strained fin structure.

According to certain illustrative examples, a semiconductor device includes at least one fin structure formed onto a substrate, an isolation structure surrounding a lower portion of the fin structure, a high-k metal gate formed over the fin structure such that the fin structure extends into the gate structure, and an interlayer dielectric structure surrounding the metal gate. The border between the isolation structure and the interlayer dielectric structure is positioned between a top and a bottom of the metal gate.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes andor achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a semiconductor device, the method comprising:

forming a fin structure on a substrate, wherein the fin structure includes a three-dimensional channel region disposed between source/drain regions;

forming a set of shallow trench isolation (STI) regions such that an upper portion of the fin structure that includes the three-dimensional channel is above the set of shallow trench isolation regions such that the upper portion extends vertically from a topmost surface of the fin structure to a depth substantially coplanar with a topmost surface of the set of shallow trench isolation regions and extends horizontally from a first side surface of the fin structure to a second side surface of the fin structure that is opposite the first side surface, wherein a first STI region of the set of STI regions is disposed on a first side of the fin structure and a second STI region of the set of STI regions is disposed on a second side of the fin structure;

forming a dummy gate over a first region of the upper portion of the fin structure, the first region including the three-dimensional channel region of the fin structure;

forming an interlayer dielectric layer around the dummy gate;

removing the dummy gate to expose the first region of the upper portion of the fin structure the first region including a top surface and opposing side surfaces of the three-dimensional channel region of the fin structure; and after removing the dummy gate, introducing a strain into a crystalline structure of the exposed three-dimensional channel region of the fin structure by doping a semiconductor material into and throughout the first region of the upper portion of the fin structure such that the entire upper portion of the first region of the fin structure including the entire three-dimensional channel region is doped.

2. The method of claim 1, further comprising, forming active regions in the substrate adjacent an opening left by removal of the dummy gate.

3. The method of claim 2, further comprising:
forming a high-k dielectric layer over the fin structure; and
forming a metal gate in the opening left by the removal of the dummy gate.

4. The method of claim 1, wherein the doping of the semiconductor material is done through one of: ion implantation and diffusion.

5. The method of claim 1, further comprising:
forming an additional fin structure connected to a different type of doped substrate; and
forming an additional dummy gate over the additional fin structure.

6. The method of claim 5, further comprising:
removing the additional dummy gate; and
replacing the additional dummy gate with an additional metal gate while not straining the additional fin structure.

7. The method of claim 1 further comprising:
forming a gate surrounding the three-dimensional channel region after the introducing of the strain therein, wherein the implanted semiconductor material extends throughout the surrounded three-dimensional channel region.

8. The method of claim 1, further comprising, forming sidewall spacers on the dummy gate before forming the interlayer dielectric layer.

9. A method of forming a semiconductor device, the method comprising:
forming a first three-dimensional channel region of a first device extending above a substrate;

forming a second three-dimensional channel region of a second device within an upper portion of a second fin that extends above the substrate, wherein the upper portion of the second fin extends from a top surface of the second fin to a depth substantially coplanar with a top surface of an isolation feature adjacent to the second fin and extends from a side surface of the second fin to an opposing side surface of the second fin;

forming a first dummy gate structure on the first three-dimensional channel region and a second dummy gate structure on a first region of the second fin, the first region including the second three-dimensional channel region;

removing the first and second dummy gate structures; and thereafter, selectively imparting a strain on the second three-dimensional channel region such that the strain of the second three-dimensional channel region is different than a strain of the first three-dimensional channel region, wherein the imparting of the strain includes doping a material throughout the entire first region of the upper portion of the second fin including the entire second three-dimensional channel region.

10. The method of claim 9, wherein the imparting of the strain is performed based on one of the first device and the second device being an n-type device and the other of the first device and the second device being a p-type device.

11. The method of claim 9, wherein the imparting of the strain includes doping the second three-dimensional channel region with the material using at least one of: ion implantation or diffusion.

12. The method of claim 11, wherein the material includes germanium.

13. The method of claim 9, wherein the imparting of the strain includes:
etching a portion of the second three-dimensional channel region and
performing an epitaxial process to grow a strained semiconductor material on a surface of the etched portion.

14. The method of claim 9 further comprising:
forming source/drain regions on the substrate before removing the first and second dummy gate structures; and
annealing the source/drain regions before removing the first and second dummy gate structures.

15. A method comprising:
receiving a substrate having a first fin and a second fin each extending above the substrate, wherein the second fin has an upper portion that extends vertically from the topmost surface of the second fin to a depth substantially coplanar with a topmost surface of an isolation feature adjacent to the second fin and that extends horizontally an entire thickness of the second fin;
forming a first dummy gate on the first fin surrounding a first channel region and a second dummy gate on the second fin surrounding a second channel region, wherein the second channel region is disposed within the upper portion of the second fin;
depositing an inter-layer dielectric on the substrate and around the first and second dummy gates;
removing the second dummy gate to expose a top surface and side surfaces of the second channel region of the second fin;
after removing the second dummy gate, modifying a strain of the second fin relative to the first fin by doping a semiconductor material throughout the entire second channel region.

16. The method of claim 15, wherein the strain of the second fin is selected based on a type of a device associated with the second fin.

17. The method of claim 15, wherein the semiconductor material includes germanium.

\* \* \* \* \*